United States Patent
Wu et al.

[11] Patent Number: 5,899,747
[45] Date of Patent: May 4, 1999

[54] METHOD FOR FORMING A TAPERED SPACER

[75] Inventors: Kuo-Chang Wu, Taichung; Tzu-Shih Yen, Taipei, both of Taiwan

[73] Assignee: Vanguard International Semiconductor Corporation, Hsinchu, Taiwan

[21] Appl. No.: 08/789,121

[22] Filed: Jan. 27, 1997

[51] Int. Cl.[6] .................................................. H01L 21/302
[52] U.S. Cl. ............................................. 438/704; 438/713
[58] Field of Search ................................. 438/260, 265, 438/696, 701, 714, 713, 704

[56] References Cited

U.S. PATENT DOCUMENTS

| | | |
|---|---|---|
| 3,756,875 | 9/1973 | Eccleston et al. . |
| 4,715,930 | 12/1987 | Diem . |
| 4,760,033 | 7/1988 | Mueller . |
| 4,776,922 | 10/1988 | Bhattacharyya et al. . |
| 4,981,810 | 1/1991 | Fazan et al. . |
| 5,116,460 | 5/1992 | Bukhman . |
| 5,328,860 | 7/1994 | Lee et al. . |
| 5,407,837 | 4/1995 | Eklund . |
| 5,407,847 | 4/1995 | Hayden et al. . |
| 5,684,319 | 11/1997 | Hebert . |
| 5,685,950 | 11/1997 | Sato . |

*Primary Examiner*—John F. Niebling
*Assistant Examiner*—Jonathan Hack
*Attorney, Agent, or Firm*—Christensen O'Connor Johnson & Kindness PLLC

[57] ABSTRACT

A method for forming a gate with a tapered spacer is disclosed. The method includes forming a polysilicon layer on a substrate, and then forming a first oxide layer on the polysilicon layer. A photoresist layer is formed on the first oxide layer, where the photoresist layer defines a gate region, and then portions of the oxide layer and the polysilicon layer are removed using the photoresist layer as a mask, thereby forming a gate. A second oxide layer is formed on the substrate and the first oxide layer. Afterwards, the second oxide layer is isotropically etched so that the slope of the second oxide layer near the upper corners of the gate is reduced. Finally, the second oxide layer is anisotropically etched back to form spacers on the sidewalls of the gate.

15 Claims, 3 Drawing Sheets

METHOD FOR FORMING A TAPERED SPACER

BACKGROUND

1. Field of the Invention

The present invention relates to semiconductor integrated circuit fabrication methods and, more particularly, to methods for forming spacers.

2. Background Art

FIG. 1A is a cross sectional view illustrating a gate structure 12 with a spacer 10 for use in fabricating integrated circuit metal-oxide-semiconductor field effect transistors (MOSFETs). As is well known, a trend in the semiconductor industry is to reduce as much as possible the size of integrated circuit structures. In scaling down the device size, a typical conventional process will cause the spacer 10 around the gate structure 12 to have a substantially vertical profile as shown in FIG. 1A. As is well known in the art of semiconductor integrated circuit fabrication, the vertical profile of the spacer 10 can undesirably result in the formation of "stringers" when etching a subsequent polysilicon layer deposited over the spacer 10. These stringers can detrimentally short circuit adjacent polysilicon lines formed from this polysilicon layer.

For example, as shown in FIG. 1B, a polysilicon layer 14 is subsequently deposited on the gate structure 12 and spacer 10. The polysilicon layer is then anisotropically etched to polysilicon lines 14A and 14B across the spacer 10 and gate structure 12, as shown in FIG. 1C. Because of the substantially vertical profile of the spacer 10, this etching process must be performed for a relatively long period of time (i.e., overetching) so as to ensure elimination of stringers that can be left behind on the spacer 10. Of course, the substantially vertical profile of the gate structure can detrimentally affect the step coverage of the polysilicon layer. In this example, stringers 16 can short circuit the lines 14A and 14B. Although overetching eliminates the stringers, it also reduces the process throughput and also requires that the polysilicon layer 14 have a greater thickness to compensate for the portion of the layer removed during the overetching process.

One solution to this problem is disclosed in U.S. Pat. No. 4,981,810 (the '810 patent) titled "Process For Creating Field Effect Transistors Having Reduced-Slope, Staircase-Profile Sidewall Spacers". In this type of solution, a spacer with a staircase-profile is formed to reduce the slope of the spacer. This type of solution is relatively complex in that it requires the deposition of at least two oxide layers. Further, in this type of solution, these two oxide layers are made to have different etch rates. For example, the aforementioned '810 patent discloses that an additional densification step can be used to create these different etch rates. Of course, it is generally desirable to reduce the number of process steps in the fabrication of an integrated circuit structure. Thus, there is a need for a simple method for forming a tapered spacer with relatively few process steps.

SUMMARY

In accordance with the present invention, a method is provided for forming a tapered spacer. In one embodiment adapted for forming a gate structure with a tapered spacer, a polysilicon layer is formed to serve as the gate structure. Generally, the gate structure has substantially vertical sidewalls with sharp upper corners. Afterwards, a relatively thick oxide layer is then formed over gate structure, with this oxide layer having relatively sharp corners at the adjacent to the upper corners of the gate structure. The thick oxide layer is then subject to an isotropic etching process or pretreatment. Because isotropic etching processes tend to etch sharp corners faster than planar portions of the oxide layer, the relatively sharp corners of the oxide layer are rounded. Accordingly, the slope of the oxide layer is reduced in the area near the upper corners. In one embodiment, this isotropic etching process is a standard chemical dry etch (CDE) etching process. In another embodiment, this isotropic etching process is a HF solution dip process. By controlling the thickness of the oxide layer and the duration of the isotropic pretreatment, the slope of the oxide layer adjacent to the sidewalls of the gate structure can be tuned.

Then the oxide layer is anisotropically etched to form a spacer on the sidewalls of the gate. Because the slope of the oxide layer was reduced by the isotropic pretreatment, the resulting spacer has a tapered profile. In addition, because the slope of the oxide layer can be tuned, the spacer length can also be adjusted. The resultant spacer not only aids in reducing the existence of short-prone polysilicon effect, but also adapts to form any specific slope-profile required for a particular application.

DETAILED DESCRIPTION

Figure 1A:
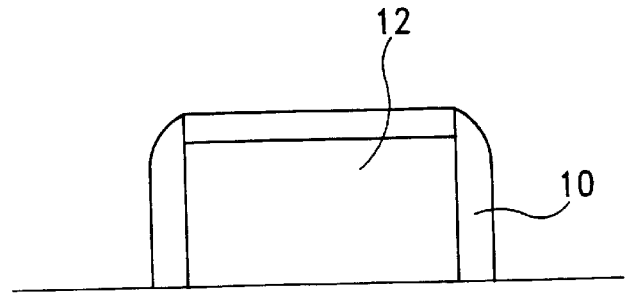
FIGS. 1A and 1B show cross sections of a gate structure with a vertical-profile spacer.
Figure 1B:
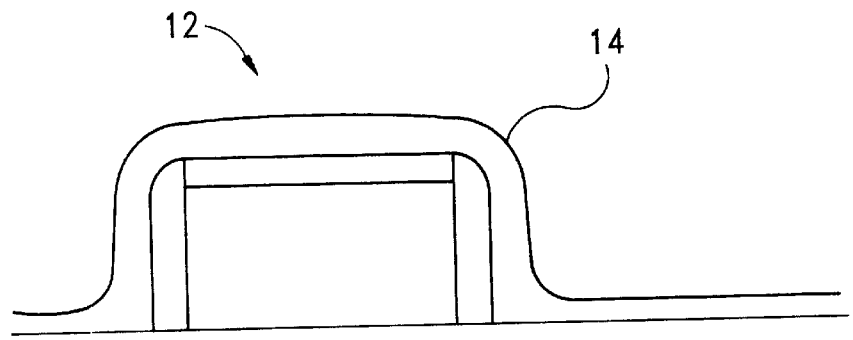
Figure 1C:
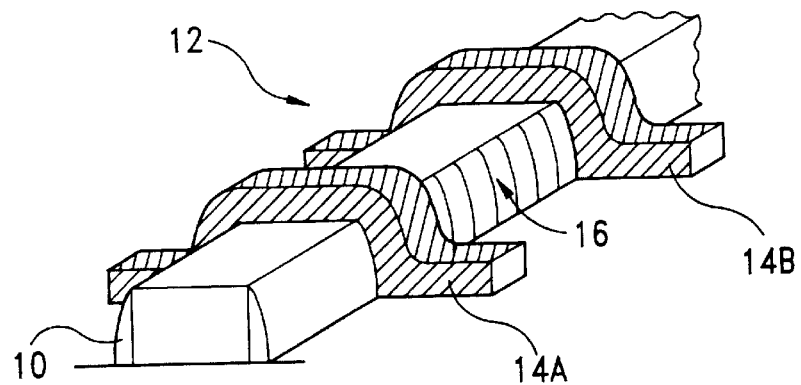
FIG. 1C shows a view illustrative of stringer formation resulting from etching polysilicon deposited over the gate structure with vertical-profile spacer.
Figure 2:
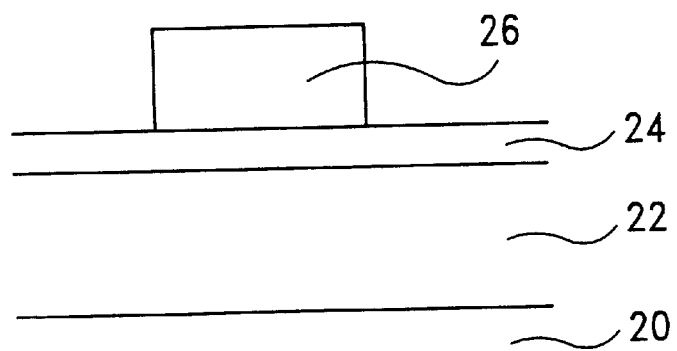
FIGS. 2 to 6 show cross-sectional views illustrative of various stages in the fabrication of a gate with a tapered spacer in accordance with one embodiment of the present invention.

FIG. 2 shows an initial stage in the fabrication of a gate with a tapered spacer on a semiconductor substrate 20. A polysilicon layer 22 is deposited above the substrate 20 using any suitable method. For clarity, the standard gate oxide layer is not shown. In this embodiment, a low pressure chemical vapor deposition (LPCVD) process is used to deposit the polysilicon layer 22. In this LPCVD process, the polysilicon layer 22 is formed by the decomposition of silane at about 550–650° C. at a pressure of about 0.2–1.0 torr, according to the reaction:

$$SiH_4 \rightarrow Si + 2H_2 \tag{1}$$

Figure 3:
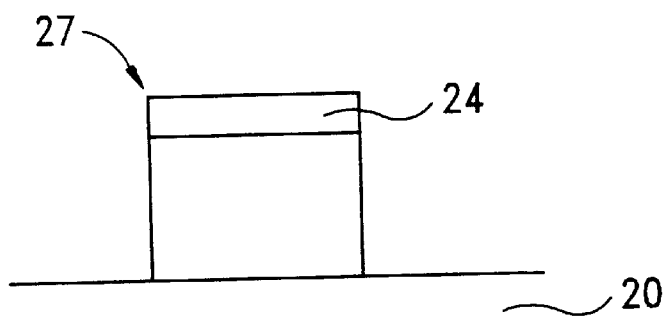

Because the polysilicon layer 22 will serve as part of a gate structure, the polysilicon layer 22 is doped to reduced resistivity using any suitable technique. For example, the polysilicon layer 22 can be doped while being deposited by adding arsine or phosphine to the silane gas mixture. Afterwards, a thin oxide layer 24 such as tetraethoxysilane (TEOS) oxide (i.e., formed from the decomposition of TEOS) layer is formed using a standard plasma enhanced CVD (PECVD) process. Next, a photoresist layer 26 is formed and patterned on the thin oxide layer 24 using conventional photolithographic techniques, defining a gate region over a portion of the substrate 20. Thereafter, a conventional anisotropic etching process is performed using the photoresist layer 26 as an etching mask, forming a gate structure consisting of the polysilicon layer 22 and the thin oxide layer 24. This gate structure has substantially vertical sidewalls with substantially square upper corners 27, shown in FIG. 3. In this embodiment, the etching process uses an anisotropic etch process for etching portions of the thin oxide layer 24 and the polysilicon layer 22.

Figure 4:
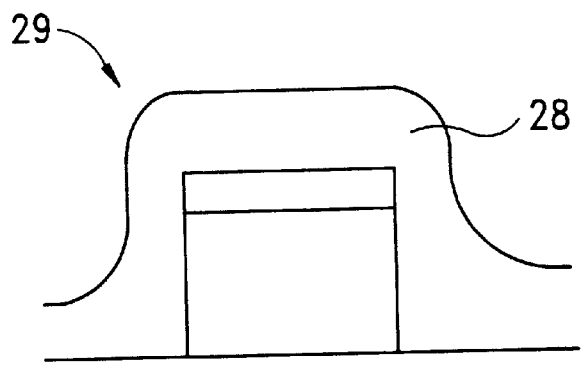

Referring to FIG. 4, a thick oxide layer 28 is formed over the substrate 20 and the thin oxide layer 24 using a standard low pressure CVD (LPCVD) process with TEOS reaction gas. The thick oxide layer 28 has relatively sharp upper corners 29 caused by the substantially square upper corners 27 of the gate structure, resulting in the thick oxide layer 28 having a profile with a relatively large slope.

Figure 5:
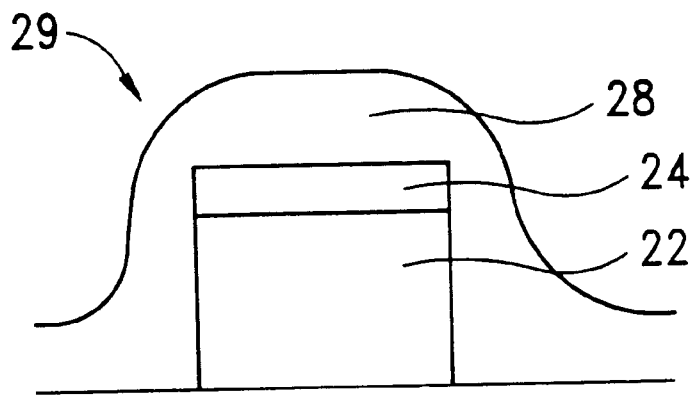

The thick oxide layer 28 is then subject to a conventional isotropic etching process or pretreatment. Any suitable isotropic process may be used, such as a chemical dry etch (CDE) method using $CF_4+O_2$ reaction gas. As is well known in the art of semiconductor processes, an isotropic etching process will etch corners more quickly than planar surfaces. In this embodiment, the thick oxide layer 28 is etched, which rounds the upper corners 29 of the thick oxide layer 28. Because the upper corners 29 are rounded, the thick oxide layer 28 has a relatively smooth tapered profile of reduced slope, as shown in FIG. 5. The slope of the oxide layer 28 near the upper corners of the gate 22, 24 is thus reduced by the isotropic etching process. In an alternative embodiment, a HF solution dip can be used instead of the aforementioned CDE process to obtain a structure substantially similar to the structure shown in FIG. 5.

Figure 6:
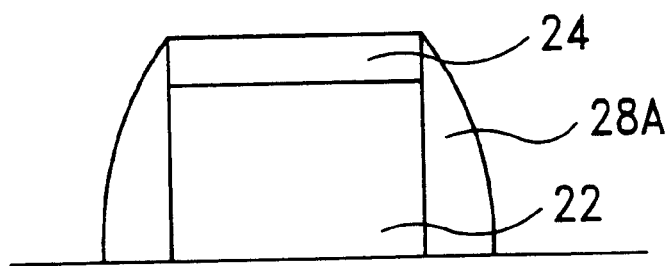

After the thick oxide layer 28 is isotropically "pretreated", a standard anisotropic etching process is performed. As a result, the thick oxide layer 28 is anisotropically etched to form a spacer 28A on the sidewalls of the gate structure formed by the polysilicon and thin oxide layers 22 and 24, as shown in FIG. 6. In this embodiment, the thick oxide layer 28 is etched back using a conventional reactive ion etch (RIE) process. Because the thick oxide layer 28 had a tapered profile, the resulting spacer 28A also has a tapered profile. The reduced slope of the tapered profile of spacer 28A not only aids in reducing the formation of short-prone stringers as mentioned above in the description of the background art, but also reduces the number of steps needed to form a spacer with a reduced slope profile, compared to the aforementioned conventional technique. In addition, the taper may be tuned by varying the thickness of the of the thick oxide layer 28 (FIG. 4), the duration of the isotropic pretreatment and/or the etch rate of the etchant process used in the pretreatment. For example, the slope of the spacer 28A is further reduced by increasing the thickness of the thick oxide layer 28 (FIG. 4) and increasing the duration of the isotropic pretreatment.

Although specific embodiments including the preferred embodiment have been illustrated and described, it will be appreciated by those skilled in the art that various modifications may be made without departing from the spirit and scope of the present invention, which is intended to be limited solely by the appended claims. For example, in other embodiments, tapered spacers are formed around structures other than gate structures.

What is claimed is:

1. A method for forming a tapered spacer around a structure disposed on a substrate, the structure having a vertical sidewall and a corner adjacent to the vertical sidewall, said method comprising:

forming a first dielectric layer over the structure, wherein said first dielectric layer has a corner adjacent to the corner of said structure;

isotropically etching said first dielectric layer, wherein said corner of said first dielectric layer is removed so that a portion of said first dielectric layer proximate to the corner of said structure has a tapered profile, said tapered profile having a slope smaller than a slope of said first dielectric layer before said isotropic etching;

anisotropically etching said first dielectric layer, wherein a residual portion of said first dielectric layer forms a spacer adjoining the vertical sidewall of the structure, said spacer having a tapered profile.

2. The method according to claim 1 wherein said structure is formed by a method comprising:

forming a polysilicon layer over the substrate;

forming a second dielectric layer on said polysilicon layer;

forming a photoresist layer on said second dielectric layer, said photoresist layer defining a gate region; and removing portions of said second dielectric and polysilicon layers not covered by said photoresist layer.

3. The method according to claim 2, wherein an anisotropic etching process is used to remove said portions of said second dielectric and polysilicon layers, using said photoresist layer as an etching mask.

4. The method according to claim 1, wherein said first dielectric layer is formed by a low pressure chemical vapor deposition method.

5. The method according to claim 4 wherein said low pressure chemical vapor deposition method comprises decomposing tetraethyl orthosilicate (TEOS).

6. The method according to claim 1, wherein a chemical dry etching process is used in isotropically etching said first dielectric layer.

7. The method according to claim 6, wherein said chemical dry etching process uses an etchant comprising $CF_4$ and $O_2$.

8. The method according to claim 1, wherein a HF solution is used in isotropically etching said first dielectric layer.

9. The method according to claim 8, wherein a reactive ion etch method is used in anisotropically etching said first dielectric layer.

10. A method for forming a tapered spacer around a metal-oxide-semiconductor field effect transistor (MOSFET) gate structure disposed on a substrate, said method comprising:

forming a polysilicon layer on the substrate;

forming a first dielectric layer on said polysilicon layer;

forming a photoresist layer on said first dielectric layer, said photoresist layer defining a gate region of said MOSFET;

anisotropically etching said polysilicon layer and said first dielectric layer using said photoresist layer as an etching mask, wherein residual portions of said polysilicon and first dielectric layers form a gate structure with sidewalls and upper corners;

forming a second dielectric layer over the substrate and said gate structure;

isotropically etching said second dielectric layer so that a slope of said second dielectric layer near said upper corners of said gate structure is reduced; and anisotropically etching back said second dielectric layer to form a spacer on said sidewall of said gate structure.

11. The method according to claim 10, wherein said second dielectric layer is an oxide layer is formed by a low pressure chemical vapor deposition method.

12. The method according to claim 11 wherein said low pressure chemical vapor deposition method comprises decomposing tetraethyl orthosilicate (TEOS).

13. The method according to claim 11, wherein a chemical dry etching process is used in isotropically etching said oxide layer.

14. The method according to claim 11, wherein a HF solution is used in isotropically etching said oxide layer.

15. The method according to claim 11, wherein a reactive ion etch method is used in anisotropically etching said oxide layer.

* * * * *

UNITED STATES PATENT AND TRADEMARK OFFICE
CERTIFICATE OF CORRECTION

PATENT NO. : 5,899,747
DATED : May 4, 1999
INVENTOR(S) : K.-C. Wu et al.

It is certified that error appears in the above-identified patent and that said Letters Patent is hereby corrected as shown below:

| COLUMN | LINE | |
|---|---|---|
| [57] Pg. 1, col. 2 | Abstract lines 12-13 of text | "anisotro-pically" should read --anisotropically-- |
| 4 (Claim 1, | line 14) | After "anisotropically etching said" insert --isotropically etched-- |
| 4 (Claim 10, | 60 line 20) | After "anisotropically etching back said" insert --isotropically etched-- |

Signed and Sealed this

Ninth Day of November, 1999

Attest:

Q. TODD DICKINSON

Attesting Officer

Acting Commissioner of Patents and Trademarks